(12) United States Patent
Abe et al.

(10) Patent No.: US 9,711,219 B2
(45) Date of Patent: Jul. 18, 2017

(54) STORAGE DEVICE INCLUDING MAGNETIC ELEMENTS

(71) Applicant: Kabushiki Kaisha Toshiba, Minato-ku (JP)

(72) Inventors: Keiko Abe, Yokohama (JP); Shinobu Fujita, Inagi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/067,708

(22) Filed: Mar. 11, 2016

(65) Prior Publication Data
US 2016/0276031 A1 Sep. 22, 2016

(30) Foreign Application Priority Data
Mar. 20, 2015 (JP) .................................. 2015-058678

(51) Int. Cl.
| | | |
|---|---|---|
| G11C 11/00 | (2006.01) | |
| G11C 14/00 | (2006.01) | |
| G11C 11/16 | (2006.01) | |
| G11C 11/412 | (2006.01) | |

(52) U.S. Cl.
CPC ...... *G11C 14/0081* (2013.01); *G11C 11/1673* (2013.01); *G11C 11/1675* (2013.01); *G11C 11/412* (2013.01)

(58) Field of Classification Search
None
See application file for complete search history.

(56) References Cited

U.S. PATENT DOCUMENTS

| | | |
|---|---|---|
| 8,174,872 B2 | 5/2012 | Sakimura et al. |
| 8,243,498 B2 | 8/2012 | Abe et al. |
| 2011/0292718 A1* | 12/2011 | Suzuki .................... G11C 11/16 365/158 |

(Continued)

FOREIGN PATENT DOCUMENTS

| | | |
|---|---|---|
| JP | 2011-187114 A | 9/2011 |
| JP | 5201487 B2 | 2/2013 |

(Continued)

*Primary Examiner* — Son Dinh
*Assistant Examiner* — Uyen B Tran
(74) *Attorney, Agent, or Firm* — Oblon, McClelland, Maier & Neustadt, L.L.P.

(57) ABSTRACT

A storage device according to an embodiment includes: first and second magnetic elements each including: a reference layer connected to a third terminal; a first magnetic layer including first through third magnetic regions; a nonmagnetic layer; a second magnetic layer connected to a first terminal and the first magnetic region; and a third magnetic layer connected to a second terminal and the third magnetic region; a first inverter including a p-channel first transistor, an n-channel second transistor, a first input terminal connected to the second terminal of the second magnetic element, and a first output terminal connected to the first terminal of the first magnetic element; and a second inverter including a p-channel third transistor, an n-channel fourth transistor, a second input terminal connected to the second terminal of the first magnetic element, and a second output terminal connected to the first terminal of the second magnetic element.

9 Claims, 16 Drawing Sheets

(56) References Cited

U.S. PATENT DOCUMENTS

| | | | |
|---|---|---|---|
| 2013/0028011 A1* | 1/2013 | Kitagawa | G11C 19/0808 365/158 |
| 2013/0113058 A1* | 5/2013 | Fukami | H01L 43/08 257/421 |
| 2014/0071728 A1 | 3/2014 | Khalili Amiri et al. | |
| 2015/0109853 A1* | 4/2015 | Sato | H01L 43/08 365/158 |

FOREIGN PATENT DOCUMENTS

| | | |
|---|---|---|
| JP | 2013-62319 A | 4/2013 |
| JP | 2013-125567 A | 6/2013 |
| WO | WO2011/118395 A1 | 9/2011 |

* cited by examiner

FIG. 13

| | | Nonvolatile Mode | | | SRAM Mode | | |
|---|---|---|---|---|---|---|---|
| | | Nonvolatile Writing | | Non-Volatile Reading | SRAM Reading | | SRAM Writing |
| | | RESET | NV-WRITE | | After Non-Volatile Reading | After SRAM Writing | |
| SRAM CELL DATA | N1 | - | 0(1) | 0(1) | 0(1) | 0(1) | 0(1) |
| | N2 | - | 1(0) | 1(0) | 1(0) | 1(0) | 1(0) |
| MTJ UNIT DATA | MTJ UNIT 1 | P | AP (P) | AP (P) | AP (P) | P | P |
| | MTJ UNIT 2 | P | P (AP) | P (AP) | P (AP) | P | P |

STORAGE DEVICE INCLUDING MAGNETIC ELEMENTS

CROSS REFERENCE TO RELATED APPLICATIONS

This application is based upon and claims the benefit of priority from prior Japanese Patent Application No. 2015-058678 filed on Mar. 20, 2015 in Japan, the entire contents of which are incorporated herein by reference.

FIELD

The present invention relates to a storage device including magnetic elements.

BACKGROUND

A processor to be used in a mobile information terminal is expected to consume a small amount of electric power. This processor includes an SRAM as a cache memory, and the data to be frequently used by the processor is stored in the SRAM serving as a cache memory. The SRAM has to constantly supply power to the volatile memory. Even at a standby time when there is no access from the processor, electric power is consumed by leakage current from transistors. The cache memory formed with the SRAM that consumes a large amount of standby electricity may be replaced with an SRAM formed with a nonvolatile element (this SRAM will be hereinafter also referred to as a nonvolatile SRAM). With this replacement, power supply can be cut off when there is no need to access the cache memory, and consumption of standby electricity can be reduced.

Nonvolatile SRAM cells based on conventional SRAM cells have been suggested as memory cells that can be made nonvolatile without any degradation of high-speed SRAM operation. In such a nonvolatile SRAM cell, a two-terminal magnetoresistance change memory element (MTJ element) is incorporated into a conventional SRAM cell formed with six transistors. In this cell, the MTJ element at 2 to 19 kΩ is connected in series to an SRAM data storing node. Because of this, static noise margin (SNM) indicating SRAM read error resistance is degraded. Further, since the two-terminal MTJ element is used, the same path is used for reading and writing, and the MTJ element has a lowered resistance to information alteration.

Meanwhile, nonvolatile flip-flops each including a three-terminal domain wall displacement element have been known. A three-terminal domain wall displacement element is a nonvolatile memory element formed with a domain wall displacement unit that records data, and an MTJ unit that reads data. When current flowing in a direction orthogonal to the domain wall is applied to the nonvolatile memory element, the domain wall moves in the direction of electrons. As a result, the magnetization direction of the MTJ unit is reversed, and the resistance value changes. Thus, data is recorded. The resistance value of the domain wall displacement unit is equal to a metal resistance, and the resistance value of the MTJ unit is several kΩ to ten and several kΩ. The above described flip-flop has the same structure as an SRAM cell. In the three-terminal domain wall displacement element, the MTJ unit is connected in series to the source of the drive transistor of the SRAM cell. Because of this, the source potential floats away from the substrate potential, and the SNM is degraded. Furthermore, current is applied to the MTJ unit every time the SRAM operates. As a result, the resistance to information alteration or the reliability of the MTJ unit is lowered.

BRIEF DESCRIPTION OF THE DRAWINGS

FIG. 13 shows the internal states of a nonvolatile SRAM cell in respective operations in the nonvolatile mode and the SRAM mode;

DETAILED DESCRIPTION

A storage device according to an embodiment includes: first and second magnetic elements each including first through third terminals, each of the first and second magnetic elements including: a first magnetic layer including first through third magnetic regions, the second magnetic region being located between the first magnetic region and the third magnetic region; a second magnetic layer connected to the first terminal and the first magnetic region; and a third magnetic layer connected to the second terminal and the third magnetic region, the third magnetic layer having a different magnetization direction from a magnetization direction of the second magnetic layer; a fourth magnetic layer connected to the third terminal and facing the second magnetic region; and a nonmagnetic layer disposed between the second magnetic region and the fourth magnetic layer; a first inverter including a p-channel first transistor, an n-channel second transistor, a first input terminal, and a first output terminal, the first input terminal being connected to the second terminal of the second magnetic element, the first output terminal being connected to the first terminal of the first magnetic element; and a second inverter including a p-channel third transistor, an n-channel fourth transistor, a second input terminal, and a second output terminal, the second input terminal being connected to the second terminal of the first magnetic element, the second output terminal being connected to the first terminal of the second magnetic element.

First Embodiment

Figure 1:
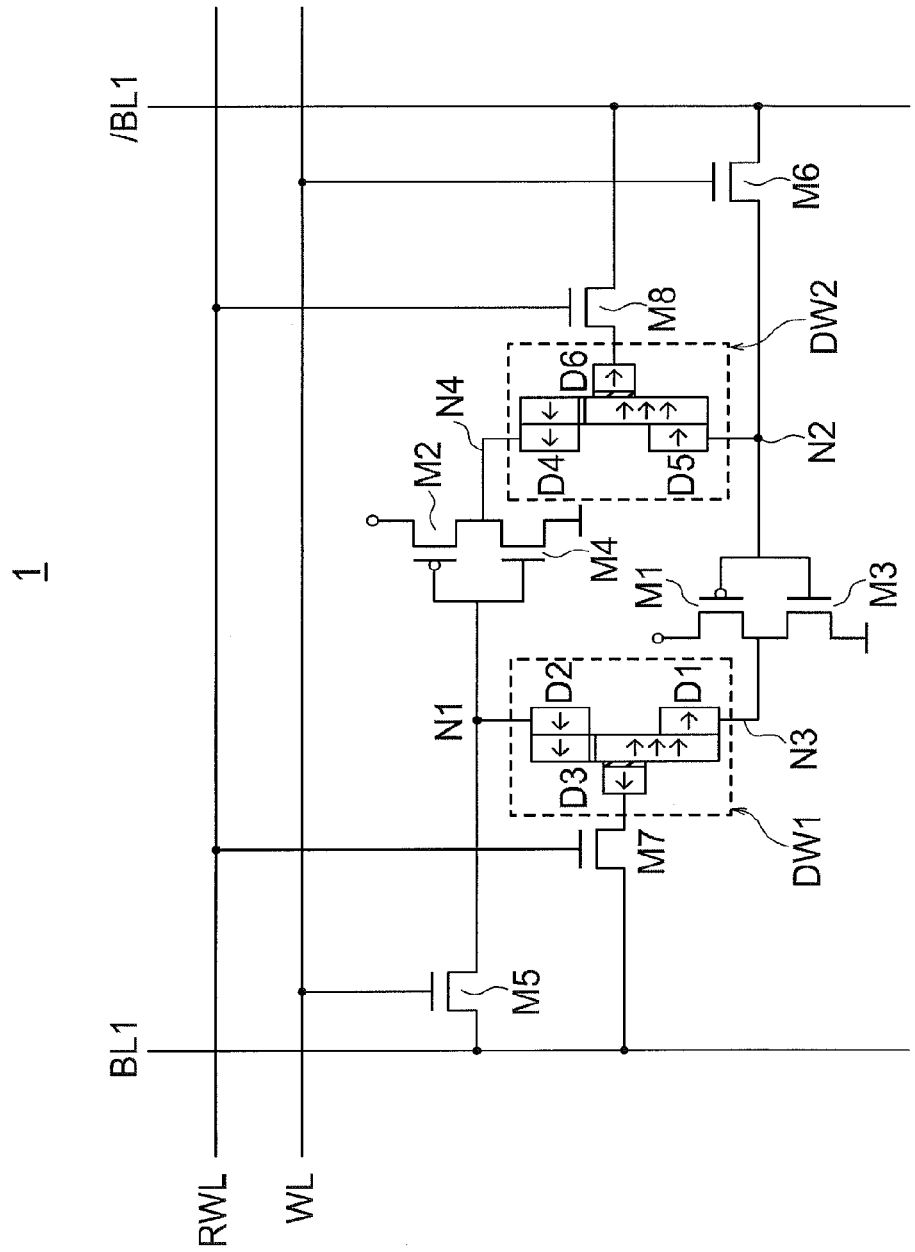
FIG. 1 is a circuit diagram showing an SRAM cell of a nonvolatile SRAM according to a first embodiment.

A nonvolatile SRAM (storage device) according to a first embodiment will be described below, with reference to the accompanying drawings. The nonvolatile SRAM of the first embodiment includes at least one nonvolatile SRAM cell. FIG. 1 is a circuit diagram of this nonvolatile SRAM cell. This SRAM cell 1 includes p-channel transistors M1 and M2, n-channel transistors M3, M4, M5, M6, M7, and M8, and domain wall displacement elements (magnetic elements) DW1 and DW2. The p-channel transistor M1 and the n-channel transistor M3 form a first inverter, and the p-channel transistor M2 and the n-channel transistor M4 form a second inverter. Each of the sources of the p-channel transistors M1 and M2 is connected to a drive voltage, and the sources of the n-channel transistors M3 and M4 are grounded. The domain wall displacement element DW1 includes three terminals D1, D2, and D3, and the domain wall displacement element DW2 includes three terminals D4, D5, and D6.

The input terminal of the first inverter is connected to a node N2, and the output terminal of the first inverter is connected to a node N3. The input terminal of the second inverter is connected to a node N1, and the output terminal of the second inverter is connected to a node N4. The terminal D1 of the domain wall displacement element DW1 is connected to the node N3, the terminal D2 is connected to the node N1, and the terminal D3 is connected to one of the source and the drain of the transistor M7. The terminal D4 of the domain wall displacement element DW2 is connected to the node N4, the terminal D5 is connected to the node N2, and the terminal D6 is connected to one of the source and the drain of the transistor M8. That is, the first inverter and the second inverter are cross-coupled via the domain wall displacement elements DW1 and DW2.

The other one of the source and the drain of the transistor M7 is connected to a bit line BL1, and the gate of the transistor M7 is connected to a read word line RWL. The other one of the source and the drain of the transistor M8 is connected to a bit line /BL1, and the gate of the transistor M8 is connected to the read word line RWL. As for the transistor M5, one of the source and the drain is connected to the bit line BL1, the other one of the source and the drain is connected to the node N1, and the gate is connected to a word line WL. As for the transistor M6, one of the source and the drain is connected to the bit line /BL1, the other one of the source and the drain is connected to the node N2, and the gate is connected to the word line WL.

Figure 2:
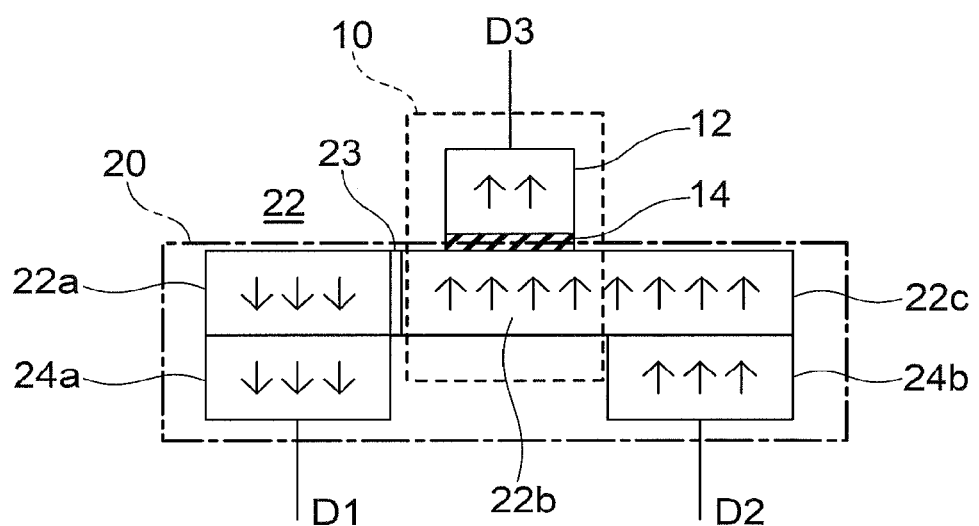
FIG. 2 is a cross-sectional view showing a domain wall displacement element used in the SRAM cell of the first embodiment.

Referring now to FIG. 2, the structure of each of the domain wall displacement elements DW1 and DW2 used in this embodiment is described. Since the domain wall displacement element DW1 and the domain wall displacement element DW2 have the same structure, the domain wall displacement element DW1 is described as an example. FIG. 2 is a cross-sectional view of the domain wall displacement element DW1.

The domain wall displacement element DW1 includes an MTJ unit 10 and a domain wall displacement unit 20. The MTJ unit 10 includes a reference layer 12, a tunnel barrier layer (a nonmagnetic layer) 14, and a magnetic region 22b. The domain wall displacement unit 20 includes a magnetic layer 22, and spin injection layers 24a and 24b made of a magnetic material. The magnetic layer 22 includes a magnetic region 22a, the magnetic region 22b adjacent to the magnetic region 22a, and a magnetic region 22c adjacent to the magnetic region 22b. The magnetic region 22a is joined to the spin injection layer 24a. The magnetic region 22b is joined to the tunnel barrier layer 14 of the MTJ unit 10. The magnetic region 22c is joined to the spin injection layer 24b. That is, the MTJ unit 10 and the domain wall displacement unit 20 share the magnetic region 22b. The spin injection layer 24a is connected to the terminal D1, the spin injection layer 24b is connected to the terminal D2, and the reference layer 12 is connected to the terminal D3.

The magnetic region 22b functions as the storage layer of the MTJ unit 10. The magnetic region 22b serves as the free layer of the magnetic layer 22, and has a variable magnetization direction. The reference layer 12 and the spin injection layers 24a and 24b each have a fixed magnetization direction. The magnetization direction of the spin injection layer 24a is antiparallel to (the opposite direction of) the magnetization direction of the reference layer 12, and the magnetization direction of the spin injection layer 24b is parallel to (the same direction as) the magnetization direction of the reference layer 12. In this specification, the magnetization direction of a magnetic layer or a magnetic region being "fixed" means that the magnetization direction does not change when a write current is applied to the magnetic layer. The magnetization direction of a magnetic layer or a magnetic region being "variable" means that the magnetization direction can change when a write current is applied to the magnetic layer. A "film surface" means the upper surface of a magnetic layer. As shown in FIG. 2, the magnetization direction of each magnetic layer is perpendicular to the film surface. That is, each magnetic layer has perpendicular magnetic anisotropy. Alternatively, the magnetization direction of each magnetic layer may be parallel to the film surface.

In this embodiment shown in FIG. 2, the magnetic region 22a and the spin injection layer 24a are ferromagnetically coupled, and the magnetic region 22c and the spin injection layer 24b are ferromagnetically coupled. With this structure, the reference layer 12, the magnetic regions 22b and 22c, and the spin injection layer 24b each have an upward magnetization direction, and the magnetic region 22a and the spin injection layer 24a each have a downward magnetization direction. Since the magnetization direction of the magnetic region 22a is antiparallel to the magnetization direction of the magnetic region 22b, a domain wall 23 is formed on the boundary between the magnetic region 22a and the magnetic region 22b.

(Operation of a Domain Wall Displacement Element)

Figure 3A:
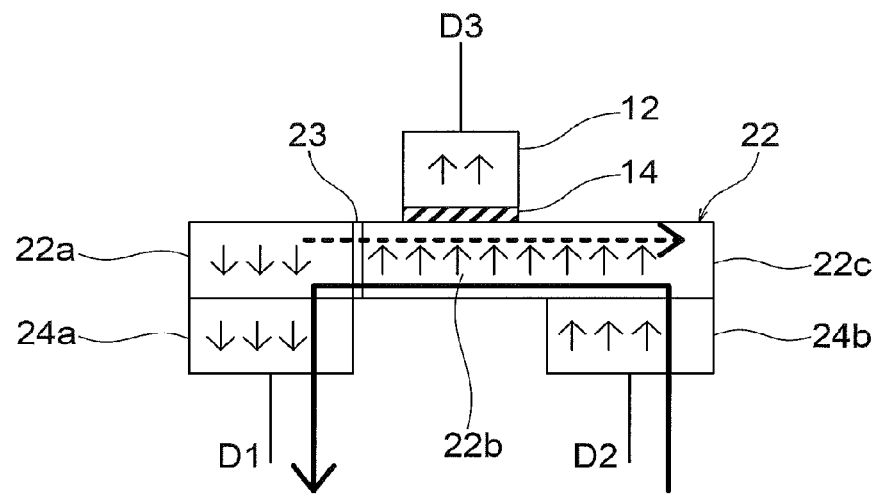
FIGS. 3A and 3B are cross-sectional diagrams for explaining a method of writing in a domain wall displacement element.
Figure 3B:
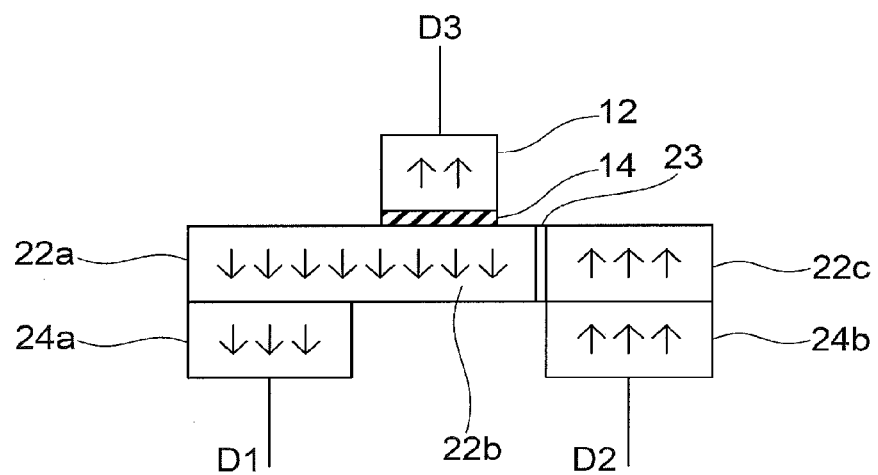

Next, operation of the domain wall displacement element DW1 is described. First, a write method is described, with reference to FIGS. 3A and 3B. FIG. 3A is a cross-sectional diagram showing the state of the domain wall displacement element DW1 prior to writing. FIG. 3B is a cross-sectional diagram showing the state of the domain wall displacement element DW1 after writing.

As shown in FIG. 3A, in the domain wall displacement element DW1, the domain wall 23 exists on the boundary between the magnetic region 22a and the magnetic region 22b. That is, the magnetization direction of the magnetic region 22b is parallel to the magnetization direction of the reference layer 12.

The method described below is a method of performing writing so that the magnetization direction of the magnetic region 22b in the above state becomes antiparallel to the magnetization direction of the reference layer 12. As shown in FIG. 3A, a write current is applied from the terminal D2 to the terminal D1 via the magnetic region 22c, the magnetic region 22b, and the magnetic region 22a. This write current is indicated by the arrow with a thick solid line in FIG. 3A. At this point, electrons flow in the opposite direction from the current. Specifically, electrons flow from the terminal D1 to the terminal D2 via the spin injection layer 24a, the magnetic region 22a, the magnetic region 22b, the magnetic region 22c, and the spin injection layer 24b, as indicated by the arrow with a dashed line in FIG. 3A. As a result, the spin in the spin injection layer 24a propagates to the magnetic region 22b through the magnetic region 22a, and the magnetization direction of the magnetic region 22b becomes the same as the magnetization direction of the magnetic region 22a as shown in FIG. 3B. That is, the domain wall 23 moves to the boundary between the magnetic region 22b and the magnetic region 22c, and the magnetization direction of the magnetic region 22b becomes antiparallel to the magnetization direction of the reference layer 12.

The method described next is a method of performing writing so that the magnetization direction of the magnetic region 22b in the state shown in FIG. 3B becomes parallel to the magnetization direction of the reference layer 12. In this case, a write current is applied from the terminal D1 to the terminal D2 via the magnetic region 22a, the magnetic region 22b, and the magnetic region 22c, which is the opposite of the above described case. At this point, electrons flow in the opposite direction from the current. Specifically, electrons flow from the terminal D2 to the terminal D1 via the spin injection layer 24b, the magnetic region 22c, the magnetic region 22b, the magnetic region 22a, and the spin injection layer 24a. As a result, the magnetization direction of the magnetic region 22b becomes the same as the magnetization direction of the magnetic region 22c, and the domain wall 23 moves to the boundary between the magnetic region 22b and the magnetic region 22a. That is, the magnetization direction of the magnetic region 22b becomes parallel to the magnetization direction of the reference layer 12, as shown in FIG. 3A.

Figure 4A:
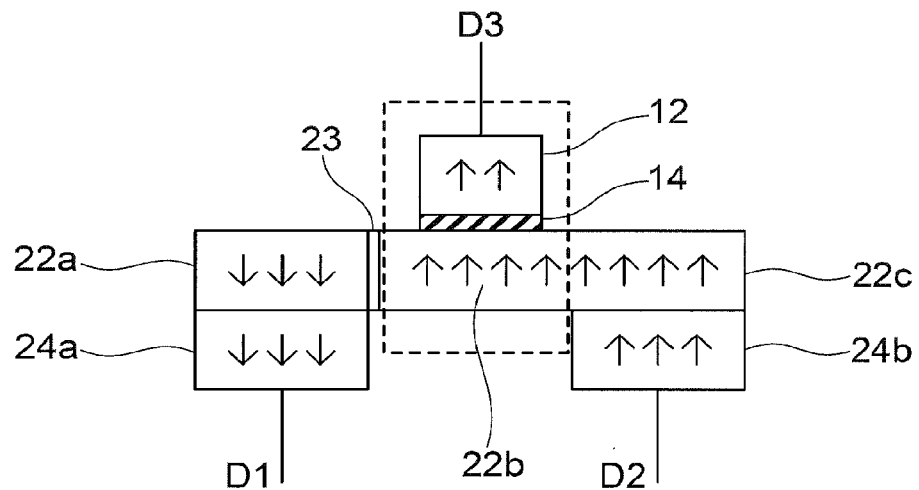
FIGS. 4A and 4B are cross-sectional diagrams for explaining a method of reading from a domain wall displacement element.
Figure 4B:
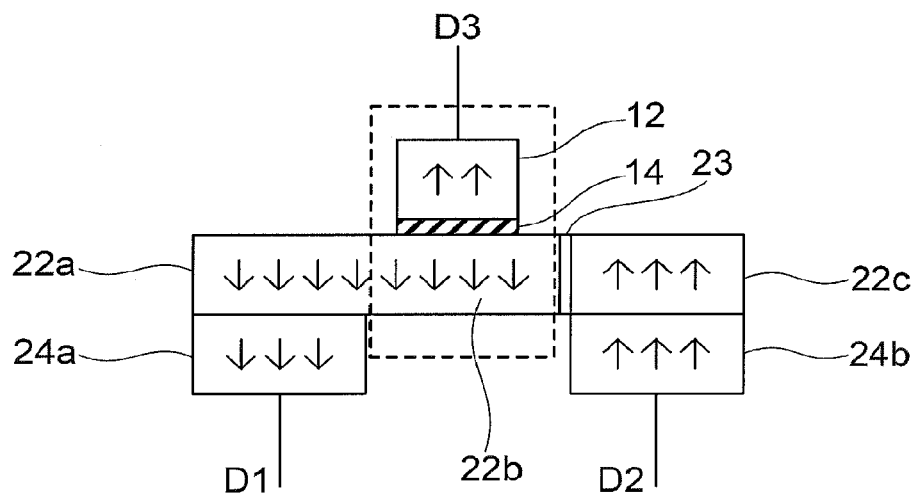

Next, a read method is described, with reference to FIGS. 4A and 4B. FIG. 4A is a cross-sectional diagram showing the domain wall displacement element DW1 in a case where the magnetization direction of the magnetic region 22b is parallel to the magnetization direction of the reference layer 12. FIG. 4B is a cross-sectional diagram showing the domain wall displacement element DW1 in a case where the magnetization direction of the magnetic region 22b is antiparallel to the magnetization direction of the reference layer 12. In each of the states shown in FIGS. 4A and 4B, reading is performed by applying a constant read current, which is smaller than the write current, between the terminal D3 and one of the terminals D1 and D2, or between the terminal D3 and the terminal D1, for example, and measuring the voltage between the terminal D3 and the terminal D1.

In the state shown in FIG. 4A, the magnetization directions of the magnetic region 22b and the reference layer 12 are parallel to each other, and therefore, the resistance between the terminal D3 and the terminal D1 is low. In the state shown in FIG. 4B, the magnetization directions of the magnetic region 22b and the reference layer 12 are antiparallel to each other, and therefore, the resistance between the terminal D3 and the terminal D1 is high. When the read current is applied between the terminal D3 and the terminal D1, the voltage between the terminal D3 and the terminal D1 is low in the state shown in FIG. 4A, and is high in the state shown in FIG. 4B. By the above described read method, the read current is applied between the terminal D3 and the terminal D1. By another read method, however, a constant read current is applied between the terminal D3 and the terminal D1, and the current flowing between the terminal D3 and the terminal D1 may be measured.

Next, operations of the nonvolatile SRAM according to the first embodiment are described. The operations of the nonvolatile SRAM according to the first embodiment include operations in a nonvolatile mode and operations in an SRAM mode. The operations in the nonvolatile mode include a nonvolatile write operation and a nonvolatile read operation. The nonvolatile write operation further includes a reset step and a NV-write step, which will be described later. The operations in the SRAM mode include an SRAM write operation and an SRAM read operation.

The nonvolatile write operation is an operation to write data into a domain wall displacement element in the nonvolatile SRAM cell. Through this operation, volatile data (SRAM data) can be turned into nonvolatile data. In the reset step of the nonvolatile write operation, the two domain wall displacement elements DW1 and DW2 in the nonvolatile SRAM cell are put into the same state, and thus are prepared for nonvolatile data writing. In the NV-write step, SRAM data is written into a domain wall displacement element, and the nonvolatile data writing is completed. The nonvolatile read operation is an operation to read nonvolatile data stored in the domain wall displacement elements DW1 and DW2 of the nonvolatile SRAM cell so that the potential levels of the nodes N1 and N2 in the SRAM cell correspond to the nonvolatile data stored in the domain wall displacement elements DW1 and DW2. This nonvolatile read operation is preferably performed immediately after power is applied to the nonvolatile SRAM, for example. This is because, immediately after power is applied to the nonvolatile SRAM, the potentials of the nodes N1 and N2 in the nonvolatile SRAM cell are in a floating state.

The operations in the SRAM mode include an SRAM write operation to write volatile data (SRAM data) from a write/read circuit into the nodes N1 and N2, and an SRAM read operation to read SRAM data from the nodes N1 and N2.

Figure 5:
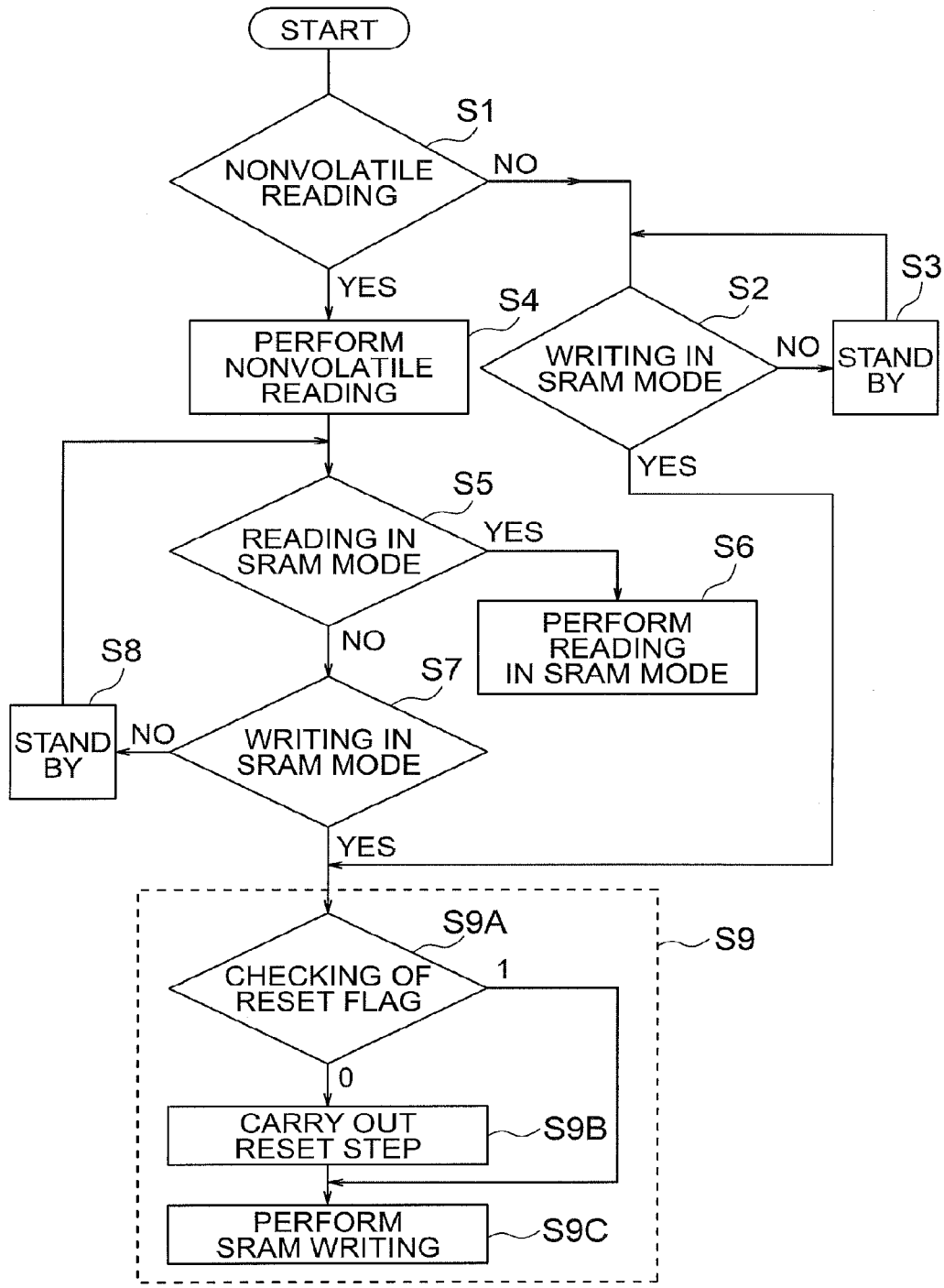
FIG. 5 is a flowchart showing the operation to be performed when power is applied to the nonvolatile SRAM of the first embodiment.

Referring now to the flowchart shown in FIG. 5, the operation to be performed when power is applied to the nonvolatile SRAM is described.

First, when power is applied to the nonvolatile SRAM, a check is made to determine whether nonvolatile data stored before power is cut off is to be used. This determination is based on whether or not nonvolatile reading is to be performed (S1). If it is determined in step S1 that nonvolatile reading is not to be performed, the operation moves on to step S2, and a check is made to determine whether writing in the SRAM mode is to be performed. If it is determined that writing in the SRAM mode is not to be performed, the nonvolatile SRAM is put into a standby state (S3). If there is a command thereafter, the operation returns to step S2. If it is determined that writing in the SRAM mode is to be performed, the operation moves on to step S9 to perform writing in the SRAM mode as described later. If it is determined in step S1 that nonvolatile reading is to be performed, the operation moves on to step S4, and nonvolatile reading is performed.

In step S5, a check is made to determine whether reading in the SRAM mode is to be performed. If it is determined that reading in the SRAM mode is to be performed, the operation moves on to step S6, and reading in the SRAM mode is performed. If it is determined that reading in the SRAM mode is not to be performed, the operation moves on to step S7, and a check is made to determine whether writing in the SRAM mode is to be performed.

If it is determined in step S7 that writing in the SRAM mode is not to be performed, the operation moves on to step S8, and the nonvolatile SRAM is put into a standby state. If there is a command thereafter, the operation returns to step S5. If it is determined in step S7 that writing in the SRAM mode is to be performed, the operation moves on to step S9, and writing in the SRAM mode is performed. This writing in the SRAM mode is performed in the three steps: checking of a reset flag (described later) (S9A), a reset step (S9B), and SRAM writing (S9C).

Figure 6:
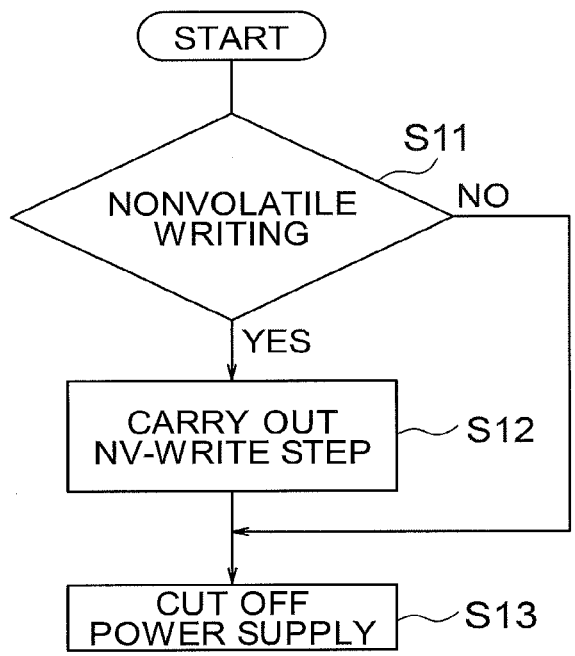
FIG. 6 is a flowchart showing the operation to be performed when power supply to the nonvolatile SRAM of the first embodiment is cut off.

Referring now to the flowchart shown in FIG. 6, the operation to be performed when the power supply to the nonvolatile SRAM is cut off is described.

First, when a command to cut off the power supply is received, a check is made to determine whether nonvolatile writing is to be performed (S11). This nonvolatile writing is performed when the current SRAM data is stored as nonvolatile data, for example. If it is determined that nonvolatile writing is not to be performed, the operation moves on to step S13, and the power supply is cut off. If it is determined that nonvolatile writing is to be performed, the operation moves on to step S12, and the NV-write step is carried out. The operation then moves on to step S13, and the power supply is cut off. Although the NV-write step is carried out before the power supply is cut off in the above described example, nonvolatile data may be stored when necessary during a system operation, for example, regardless of whether the power supply is to be cut off.

As described above, the nonvolatile SRAM stores necessary data as nonvolatile data, so that the power supply to the nonvolatile SRAM can be cut off when there is no access to any memory. Thus, standby power consumption can be made smaller than that with a conventional SRAM.

(Nonvolatile Mode)

Next, operations in the nonvolatile mode are described.

(Nonvolatile Write Operation)

Figure 7A:
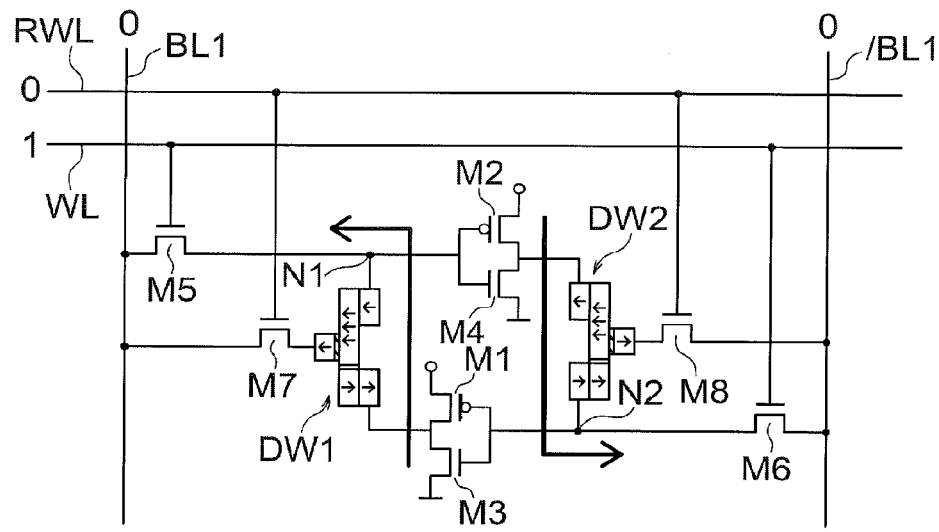
FIGS. 7A, 7B, 8A, and 8B are circuit diagrams for explaining a nonvolatile write method according to the first embodiment.
Figure 7B:
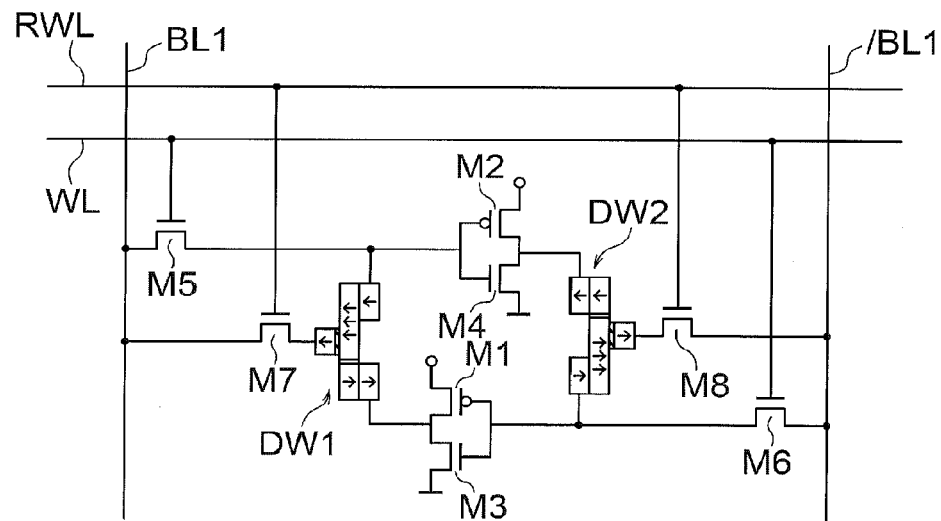
Figure 8A:
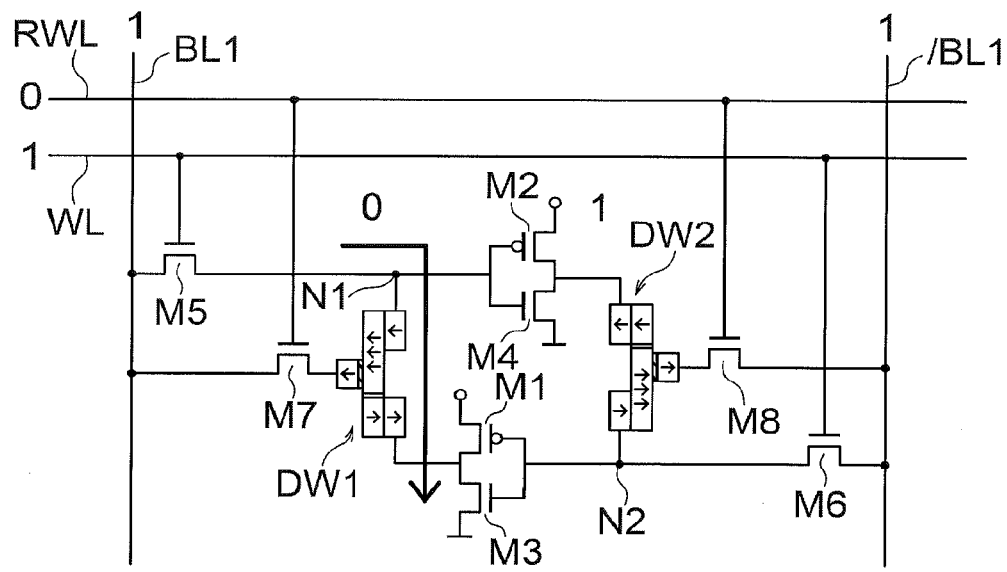
Figure 8B:
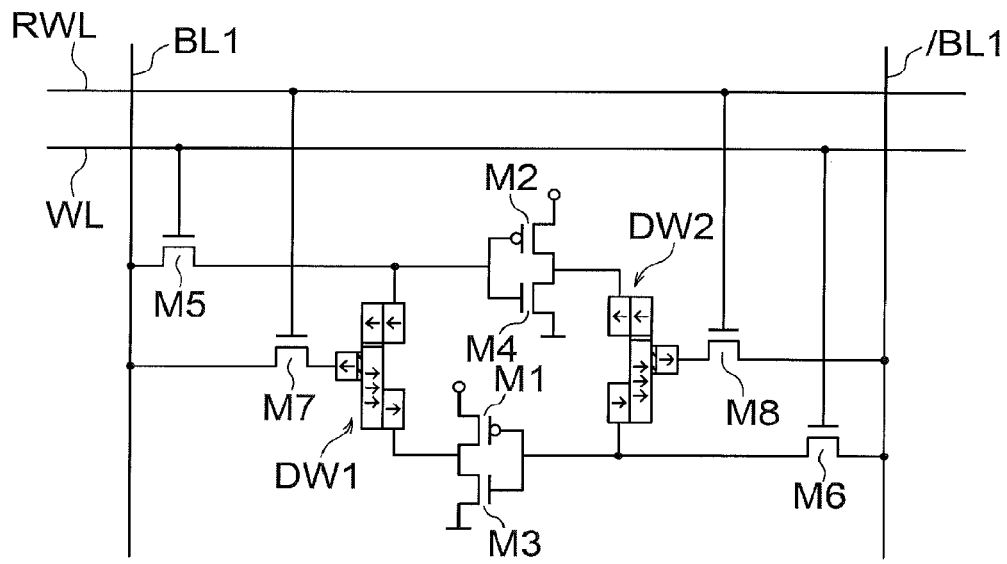

In this embodiment, writing in the nonvolatile mode (nonvolatile writing) is completed in the two steps: the reset step shown in FIGS. 7A and 7B, and the NV-write step shown in FIGS. 8A and 8B. First, in the reset step, the data storage states of the two domain wall displacement elements DW1 and DW2 are equalized. The data storage state of one of the domain wall displacement elements DW1 and DW2 is then changed in accordance with the data written in the SRAM mode in the NV-write step.

Since the reset step destroys SRAM data, the reset step should be carried out prior to SRAM writing. The reset step should also be carried out once prior to the NV-write step. In view of this, the reset flag indicating that the reset step has been carried out is provided, and, after the reset step is carried out once, the reset flag is changed from "0" to "1". This reset flag is checked prior to SRAM writing, and, if the reset flag is "1", there is no need to carry out the reset step. As a result, the power and time necessary for the reset step can be saved. Although the reset flag is not shown in the drawings, one bit is provided for the memory cells (one line) on which writing is to be simultaneously performed, for example. The reset flag may be either a nonvolatile memory or a volatile memory. In a case where the reset flag is formed with a volatile memory, the reset flag is set at the initial data (0) every time after the system is activated (or immediately after power is applied, for example).

The NV-write step is carried out after SRAM writing in accordance with a command from the system. Nonvolatile data is not stored only through the reset step, and therefore, the NV-write step is carried out to complete the storing of the nonvolatile data. After the NV-write step is carried out, the reset flag is changed from "1" to "0". The NV-write step is carried out when appropriate in accordance with the purpose of use of the nonvolatile SRAM, such as before the power supply to the nonvolatile SRAM is cut off, or when necessary while power is being supplied to the nonvolatile SRAM.

In the reset step, the read word line RWL is fixed at 0 V, the bit lines BL1 and /BL1 are set at the voltage corresponding to the data "0", or at 0 V. The word line WL is then selected. With this, current flows from the transistor M2 to the bit line /BL1 via the domain wall displacement element DW2 and the transistor M6, and current also flows from the transistor M1 to the bit line BL1 via the domain wall displacement element DW1 and the transistor M5 (see FIG. 7A). In this manner, the magnetization directions of the reference layers and the storage layers in the respective MTJ units of the domain wall displacement elements DW1 and DW2 are put into a parallel state (a low-resistance state) (see FIG. 7B). In FIGS. 7A and 7B, the magnetization directions of the reference layer and the storage layer in the MTJ unit of the domain wall displacement element DW2 change from an antiparallel state to a parallel state, but the magnetization directions of the reference layer and the storage layer in the domain wall displacement element DW1 do not change. In the reset step, the bit lines BL1 and /BL1 can be set at the voltage corresponding to the data "1". In this case, current flows from the bit line /BL1 to the transistor M4 via the transistor M6 and the domain wall displacement element DW2, and current also flows from the bit line BL1 to the transistor M3 via the transistor M5 and the domain wall displacement element DW1.

In the NV-write step, the read word line RWL is fixed at 0 V, the bit lines BL1 and /BL1 are set at the nonvolatile write voltage (such as Vdd) corresponding to the data "1". The word line WL is then selected. As a result, current flows to the side storing the SRAM data "0", or to the domain wall displacement element DW1 and the transistor M3 on the node N1 side in FIG. 8A, for example. Consequently, the MTJ unit of the domain wall displacement element DW1 is rewritten and is put into an antiparallel state (a high-resistance state) (see FIG. 8A). This NV-write step takes advantage of the same phenomenon as the current flowing to the side storing the data "0" at a time of reading in the SRAM mode as described later (see FIGS. 11A, 11B, 12A, and 12B). In view of this, there is no need to read the stored SRAM data prior to the NV-write step, and wrong writing is not performed with the read current in the SRAM mode after nonvolatile writing. In the NV-write step, the bit lines BL1 and /BL1 can be set at the voltage corresponding to the data "0", or at 0 V. In this case, current flows from the transistor M2 to the bit line /BL1 via the domain wall displacement element DW2 and the transistor M6, or current flows from the transistor M1 to the bit line BL1 via the domain wall displacement element DW1 and the transistor M5.

The voltage levels of the read word line RWL, the word line WL, the bit lines BL1 and /BL1, and the sources of the transistors M1 through M4 in the reset step and the NV-write step depend on the write characteristics and the circuit configurations of the domain wall displacement elements DW1 and DW2, and appropriate values are selected for those voltage levels.

The reset step may be carried out before the NV-write step is carried out. The NV-write step does not need to be carried out immediately after the reset step. Instead, operation may be performed in the SRAM mode after the reset step is completed, and the NV-write step may be carried out when there is a need for nonvolatile writing. Alternatively, writing may be performed simultaneously on the domain wall displacement elements at a time of reading in the SRAM mode, so that the need to carry out the NV-write step is eliminated.

(Nonvolatile Read Operation)

As described above, immediately after power is applied to the SRAM, the potentials of the nodes N1 and N2 in a SRAM cell are in a floating state. A nonvolatile read operation is performed in a case where the data prior to a cutoff of the power supply is used. In a case where the data is not used, a write operation in the SRAM mode is performed, or the SRAM is put into a standby state.

When nonvolatile data is to be read from a nonvolatile SRAM cell, the power supply to the memory array in which SRAM cells are arranged in a matrix fashion is in an off state, and the respective nodes of the nonvolatile SRAM cell are in a discharged state. That is, in the initial state, the respective word potentials of the read word line RWL, the word line WL, and the bit lines BL1 and /BL1 are 0 V, the potentials of the respective power supplies to the transistors M1 and M2 and the transistors M3 and M4 are 0 V, and the potentials of the nodes N1 and N2 are also 0 V. At this point, the domain wall displacement element DW1 is assumed to be in a high-resistance state AP, and the domain wall displacement element DW2 is assumed to be in a low-resistance state P. That is, the magnetization directions of the reference layer and the storage layer of the MTJ unit in the domain wall displacement element DW1 are in an antiparallel state, and the magnetization directions of the reference layer and the storage layer of the MTJ unit in the domain wall displacement element DW2 are in a parallel state.

Figure 9A:
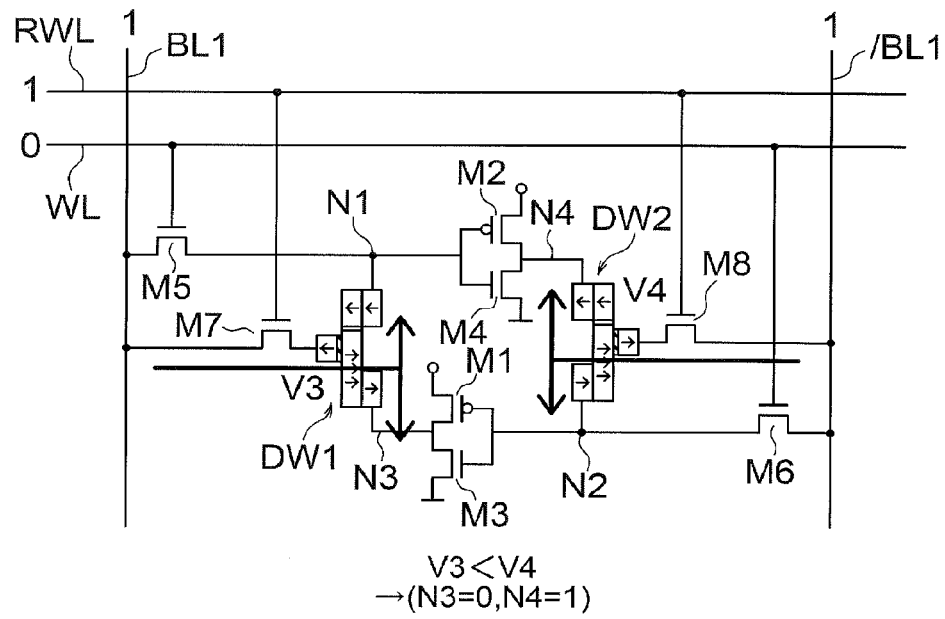
FIGS. 9A and 9B are circuit diagrams for explaining a nonvolatile read method according to the first embodiment.

In such a situation, a power supply voltage V or a precharge voltage Vpc is applied to the bit lines BL1 and /BL1, and voltage is applied so that the voltage of the read word line RWL changes from "0" ("0" level) to the power supply voltage V ("1" level), as shown in FIG. 9A. As a result, the voltage is divided in accordance with the resistance values of the domain wall displacement elements DW1 and DW2 existing respectively in series between the source power supply to the transistor M3 and the bit line BL1, and between the source power supply to the transistor M4 and the bit line /BL1. The potential of the node N3 becomes V3, and the potential of the node N4 becomes V4. Since the resistance value Rap in a high-resistance state is greater than the resistance value Rp in a low-resistance state in each of the domain wall displacement elements DW1 and DW2, the relationship between the potentials is expressed as V3<V4. When the power supply Vdd connected to the sources of the p-channel transistors M1 and M2 is activated, the difference is amplified by a cross-coupled inverter via the domain wall displacement elements DW1 and DW2.

When the potentials of the word line WL and the bit lines BL1 and /BL1 are returned to the "0" level, the potentials of the nodes N1 and N3 become the value corresponding to the data "0", and the potentials of the nodes N2 and N4 become the value corresponding to the data "1". In this manner, the data recorded in the domain wall displacement elements DW1 and DW2 is restored in the SRAM data storing nodes, and thus, the nonvolatile reading is completed.

Figure 9B:
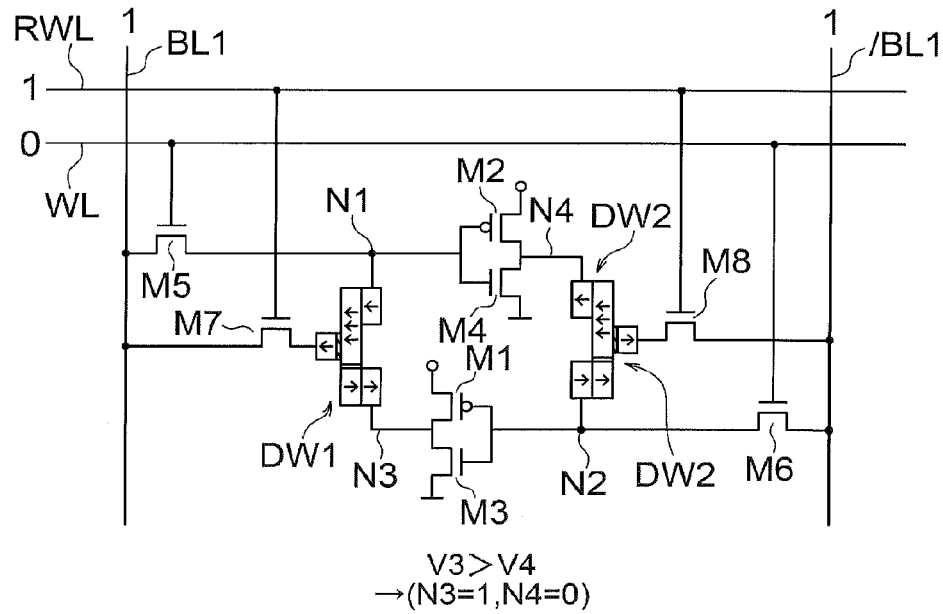

FIG. 9B shows a case where the initial state is the opposite of the initial state in the case shown in FIG. 9A. That is, the magnetization directions of the reference layer and the storage layer of the MTJ unit in the domain wall displacement element DW1 are in a parallel state, and the magnetization directions of the reference layer and the storage layer of the MTJ unit in the domain wall displacement element DW2 are in an antiparallel state. In this case, the power supply voltage V or the precharge voltage Vpc is applied to the bit lines BL1 and /BL1, and voltage is applied so that the voltage of the read word line RWL changes from "0" ("0" level) to the power supply voltage V ("1" level), as in the case shown in FIG. 9A. As a result, the voltage is divided in accordance with the resistance values of the domain wall displacement elements DW1 and DW2 existing respectively in series between the source power supply to the transistor M3 and the bit line BL1, and between the source power supply to the transistor M4 and the bit line /BL1. The potential of the node N3 becomes V3, and the potential of the node N4 becomes V4. Since the resistance value Rap in a high-resistance state is greater than the resistance value Rp in a low-resistance state in each of the domain wall displacement elements DW1 and DW2, the relationship between the potentials is expressed as V3>V4. When the power supply Vdd connected to the sources of the p-channel transistors M1 and M2 is activated, the difference is amplified by a cross-coupled inverter via the domain wall displacement elements DW1 and DW2.

When the potentials of the word line WL and the bit lines BL1 and /BL1 are returned to the "0" level, the potentials of the nodes N1 and N3 become the value corresponding to the data "1", and the potentials of the nodes N2 and N4 become the value corresponding to the data "0". In this manner, the data recorded in the domain wall displacement elements DW1 and DW2 is restored in the SRAM data storing nodes, and thus, the nonvolatile reading is completed.

(SRAM Mode)

In a write or read operation in the SRAM mode, the potential of the read word line RWL is fixed at 0 V. The same signals as those used in a regular SRAM read or write operation are supplied to the word line WL and the bit lines BL1 and /BL1, and the write or read operation in the SRAM mode is performed.

(SRAM Write Operation)

Figure 10A:
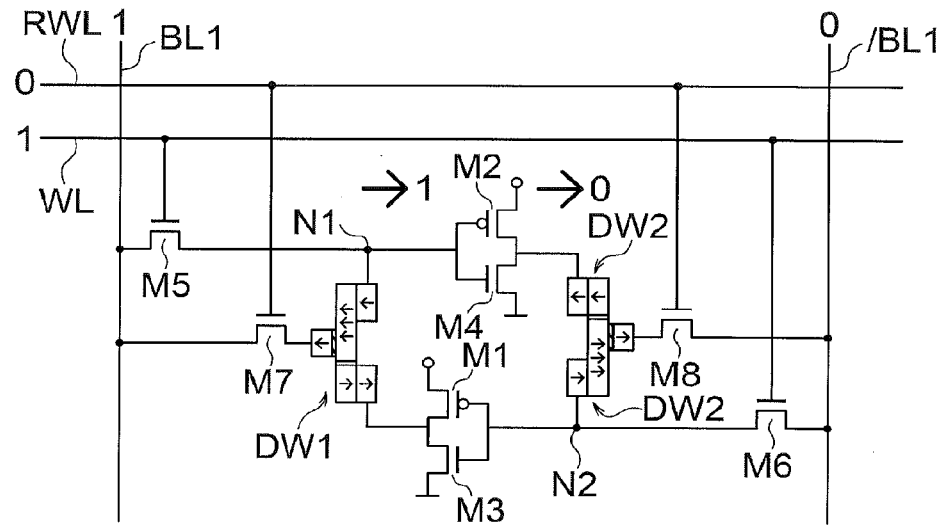
FIGS. 10A and 10B are circuit diagrams for explaining a method of writing in an SRAM mode according to the first embodiment.
Figure 10B:
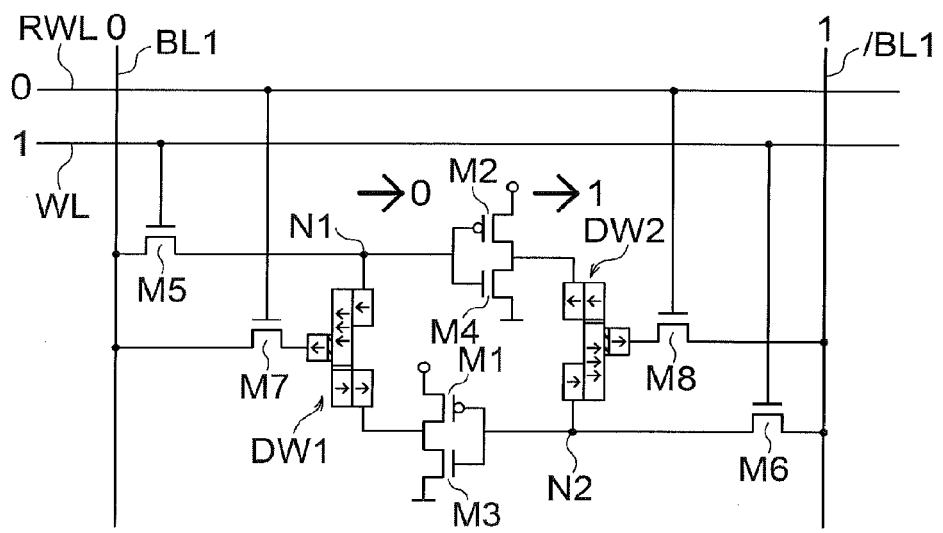

Referring now to FIGS. 10A and 10B, a write operation in the SRAM mode is described. FIG. 10A is a circuit diagram showing an SRAM cell in a case where the data "1" is to be written into the node N1 and the data "0" is to be written into the node N2. FIG. 10B is a circuit diagram showing an SRAM cell in a case where the data "0" is to be written into the node N1 and the data "1" is to be written into the node N2.

As shown in FIG. 10A, in writing, the write voltage corresponding to "1" and the write voltage corresponding to "0" are applied to the bit lines BL1 and /BL1, respectively, and a voltage for selecting the word line WL or the voltage corresponding to "1" is applied to the word line WL. As a result, the transistors M5 and M6 are turned on, and the data "1" and the data "0" are written into the data storing nodes N1 and N2 of the SRAM cell, respectively.

In this writing, if the opposite data of the data to be written is stored in the nodes N1 and N2 prior to the writing, or if the data "0" and the data "1" are stored in the nodes N1 and N2, respectively, prior to the writing, current might be applied to the domain wall displacement element DW1 for a very short period of time (on the psec order). Before the write voltage is applied, the potential of the node N2 is at the "1" level, and the potential of the node N1 is at the "0" level. Accordingly, the transistor M3 is in an on state. Because of this, current flows from the bit line BL1 to the transistor M3 via the transistor M5 and the domain wall displacement element DW1 for the period of time (on the psec order) from the application of the write voltage till the switching of the transistor M3 to an off state. However, the time required for the transistor M3 to switch from an on state to an off state is much shorter than the time (>the nsec order) required for inverting the nonvolatile data stored in the domain wall displacement element DW1, and the current flowing in the domain wall displacement element DW1 is smaller than the current for inverting the nonvolatile data stored in the domain wall displacement element DW1. Because of this, the states of the domain wall displacement elements DW1 and DW2 that are equalized in the reset step are not rewritten.

In a case where the data "0" and the data "1" are to be written into the data holding nodes N1 and N2 of the SRAM cell, the voltage corresponding to "0" and the voltage corresponding to "1" are applied to the bit lines BL1 and /BL1, respectively, and the power supply voltage for selecting the word line WL is applied to the word line WL, as shown in FIG. 10B. As a result, the transistors M5 and M6 are turned on, and the data "0" and the data "1" are written into the data storing nodes N1 and N2 of the SRAM cell, respectively. In this writing, if the opposite data of the data to be written is stored in the nodes N1 and N2 prior to the writing, or if the data "1" and the data "0" are stored in the nodes N1 and N2, respectively, prior to the writing, current might be applied from the bit line /BL1 to the domain wall displacement element DW2 and the transistor M4 via the transistor M6 for a very short period of time (on the psec order), as in the case shown in FIG. 10A. In this case, the very short period of time is the time (on the psec order) required for the transistor M4 to switch from an on state to an off state, and the current flowing in the domain wall displacement element DW2 is smaller than the current for inverting the nonvolatile data stored in the domain wall displacement element DW2. Because of this, the states of the domain wall displacement elements DW1 and DW2 are not rewritten, as in the above described case.

(SRAM Read Operation)

Figure 11A:
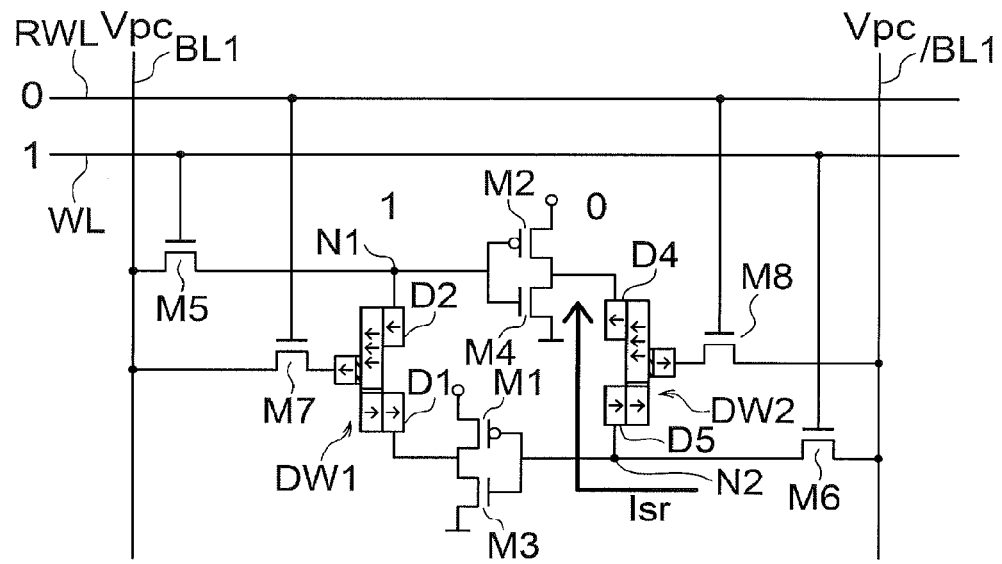
FIGS. 11A, 11B, 12A, and 12B are circuit diagrams for explaining a method of reading in the SRAM mode according to the first embodiment.
Figure 11B:
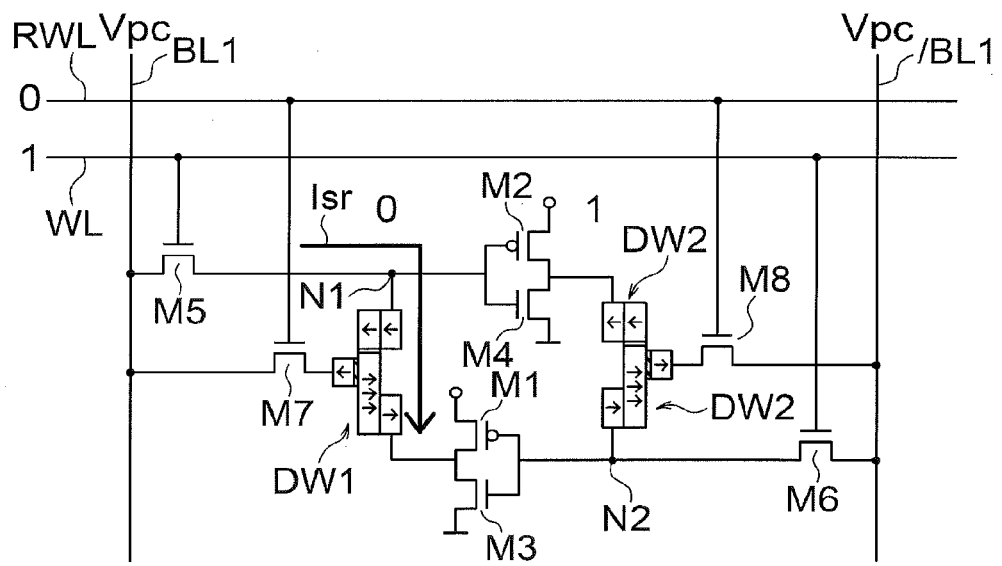
Figure 12A:
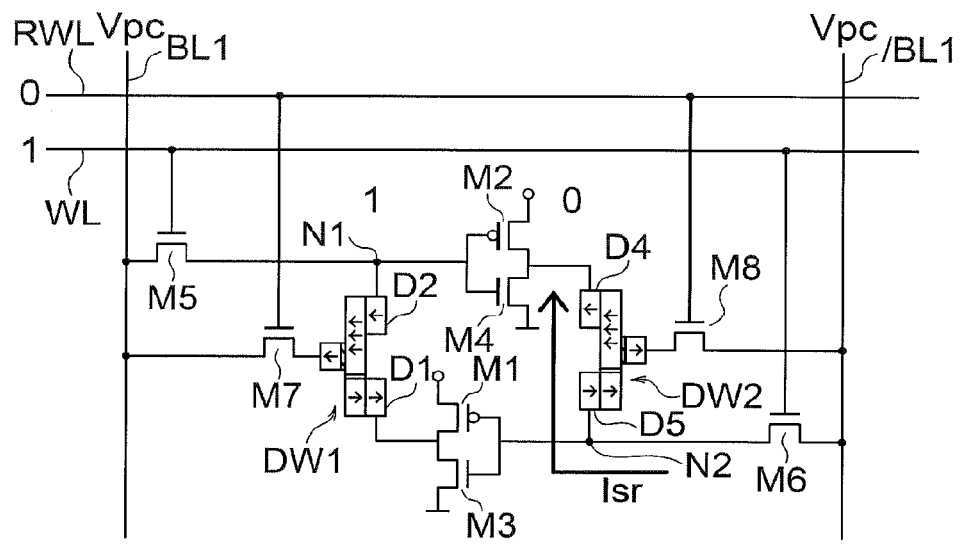
Figure 12B:
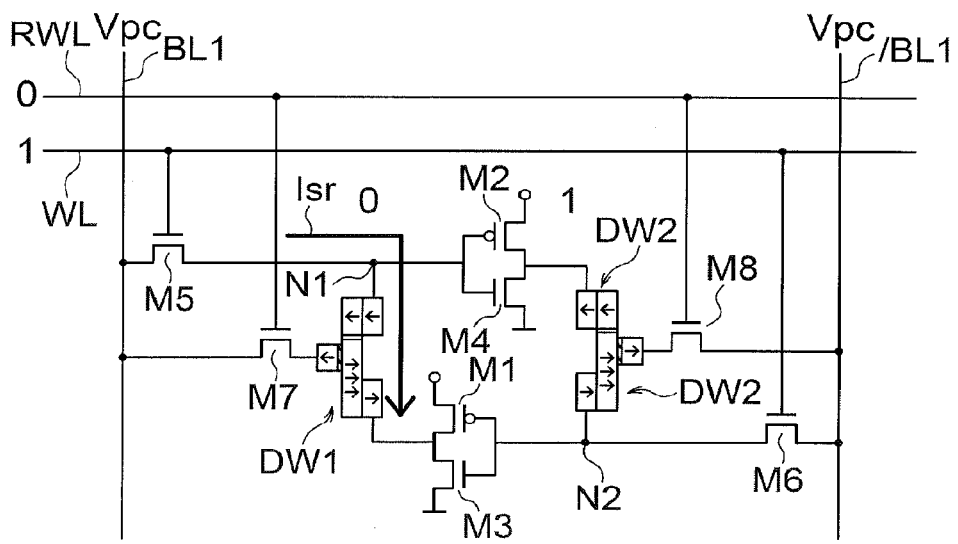

Referring now to FIGS. 11A through 12B, a read operation in the SRAM mode is described. FIG. 11A is a circuit diagram showing an SRAM cell in which the data "1" is stored in the node N1 and the data "0" is stored in the node N2 as a result of SRAM writing after the reset step. FIG. 11B is a circuit diagram showing an SRAM cell in which the data "0" is stored in the node N1 and the data "1" is stored in the node N2 as a result of SRAM writing after the reset step. FIG. 12A is a circuit diagram showing an SRAM cell in which the data "1" is stored in the node N1 and the data "0" is stored in the node N2 after nonvolatile reading. FIG. 12B is a circuit diagram showing an SRAM cell in which the data "0" is stored in the node N1 and the data "1" is stored in the node N2 after nonvolatile reading.

In any of the cases, reading is started at the precharge voltage Vpc for precharging the bit lines BL1 and /BL1. The precharge voltage Vpc has half the value of the power supply voltage Vdd, for example. When the word line WL is selected, and the power supply voltage V is applied, the transistor M4 having its gate connected to the node storing the data "1" or the node N1 in FIGS. 11A and 12A, for example, is put into an on state, and the node storing the data "0" or the side of the node N2 in FIGS. 11A and 12A is connected to GND via the transistor M4, for example. As a result, an SRAM data read current Isr flows from the bit line /BL1 via the transistor M6, the domain wall displacement element DW2, and the transistor M4. In the cases shown in FIGS. 11B and 12B, the node storing the data "1" is the node N2. The transistor M3 having its gate connected to the node N2 is put into an on state, and the node storing the data "0" or the side of the node N1 is connected to GND via the transistor M3 in FIGS. 11B and 12B, for example. As a result, the SRAM data read current Isr flows from the bit line BL1 via the transistor M5, the domain wall displacement element DW1, and the transistor M3.

In this stage, it is preferable to pay attention to the connection between the respective terminals of the domain wall displacement elements DW1 and DW2 so that the data storage states of the domain wall displacement elements DW1 and DW2 do not change due to the application of the read current. In view of this, as shown in FIGS. 11A and 12B, the terminal D1 of the domain wall displacement element DW1 is connected to the output terminal of the inverter formed with the transistors M1 and M3, and the terminal D2 is connected to the drain terminal of the transistor M5. The terminal D4 of the domain wall displacement element DW2 is connected to the output terminal of the inverter formed with the transistors M2 and M4, and the terminal D5 is connected to the drain terminal of the transistor M6. In this arrangement, application of a read current to a domain wall displacement element is in the direction of the write current for the same data as the data stored in the domain wall displacement element, and thus, wrong writing is not performed.

FIG. 13 shows the internal states of a nonvolatile SRAM cell in the respective operations in the nonvolatile mode and the SRAM mode described above. In FIG. 13, an MTJ unit 1 is the MTJ unit of the domain wall displacement element DW1, and an MTJ unit 2 is the MTJ unit of the domain wall displacement element DW2.

In SRAM cell data, the meanings of the data (information) of the node N1 being 0 (1), and the data (information) of the node N2 being 1 (0) are as follows. When the data of the node N1 is "0", the data of the node N2 is "1". When the data of the node N1 is "1", the data of the node N2 is "0".

In MTJ unit data, a symbol P means that the magnetization directions of the MTJ units of the domain wall displacement elements DW1 and DW2 are parallel to each other, and a symbol AP means that the magnetization directions are antiparallel to each other. The meanings of the data of the MTJ unit 1 being AP (P), and the data of the MTJ unit 2 being P (AP) are as follows. When the data of the MTJ unit 1 is AP, the data of the MTJ unit 2 is P. When the data of the MTJ unit 1 is P, the data of the MTJ unit 2 is AP.

As is apparent from the above description, in each SRAM of this embodiment and the later described second embodiment, SRAM data is used while power is being supplied to the nonvolatile SRAM (while the nonvolatile SRAM is in operation). Because of this, the SRAM data stored in a nonvolatile SRAM cell may differ from the nonvolatile data stored in the domain wall displacement element connected to the node storing this SRAM data. In a case where the power supply to the SRAM is to be cut off, however, the same data as the SRAM data prior to the cutoff is preferably written into the domain wall displacement elements DW1 and DW2 by a nonvolatile write method before the power supply is cut off.

Since each domain wall displacement element is made of a low-resistance material, no high-resistance regions such as an MTJ unit exist on the signal path during a read operation in the SRAM mode. Thus, SNM will not be degraded. Furthermore, during an operation in the SRAM mode, current does not flow in the direction toward the terminal D3 of the MTJ unit, and no stress is applied to the tunnel barrier layer 14. Thus, resistance to information alteration becomes higher.

As described above, according to this embodiment, SRAM cells can be made nonvolatile, without any SNM degradation. Also, stress on each MTJ unit decreases, and the resistance to information alteration becomes higher. That is, decrease in reliability can be prevented.

As for each of the transistors M1 through M8, a gate length and a gate width are selected so that reading or writing is stably performed when the nonvolatile SRAM cell is operated as an SRAM. Further, for each of the transistors M1 through M8, a gate length and a gate width should be selected so that a sufficient write current can be applied to the domain wall displacement unit when a nonvolatile SRAM cell is operated as a nonvolatile memory or when data is recorded into a domain wall displacement element. The selection of the gate length and the gate width of each of the transistors M1 through M8 are related to the voltage levels of the word line WL, the read word line RWL, the bit lines BL1 and /BL1, the sources of the p-channel transistors M1 and M2, and the sources of the n-channel transistors M3 and M4. It is preferable to determine an optimum combination through a circuit simulation in conjunction with the characteristics of the domain wall displacement elements.

Figure 14:
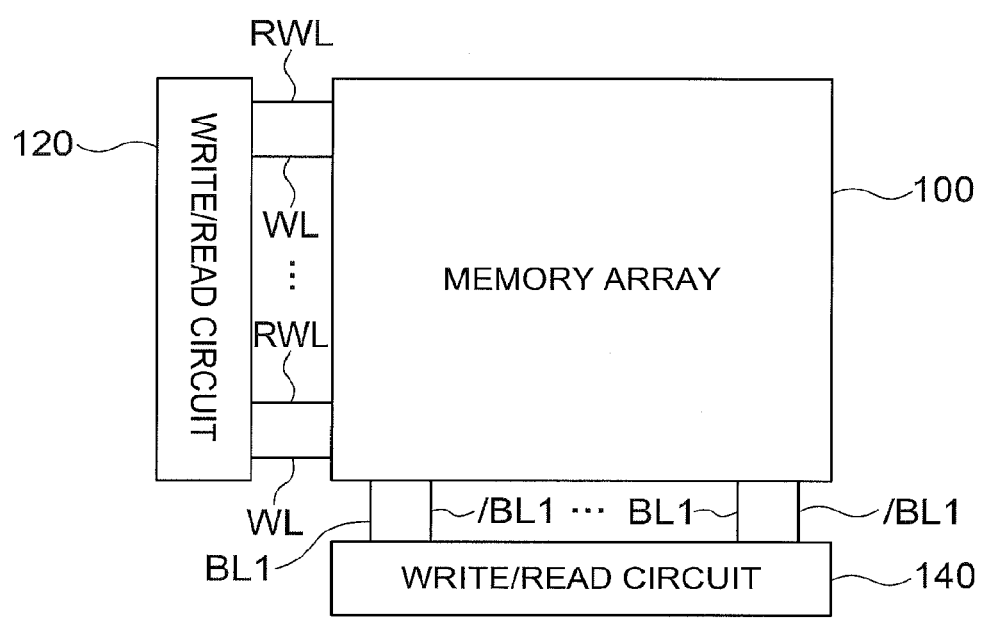
FIG. 14 is a block diagram showing the nonvolatile SRAM of the first embodiment.

Writing and reading in the SRAM mode and the nonvolatile mode according to the first embodiment are conducted by write/read circuits. FIG. 14 shows a nonvolatile SRAM that includes a memory array 100 in which nonvolatile SRAM cells 1 that are the same as the nonvolatile SRAM cell 1 shown in FIG. 1 are arranged in a matrix fashion, and write/read circuits 120 and 140. At a time of reading or writing, the write/read circuit 120 drives the read word line RWL and the word line WL as described above, and controls the voltage to be applied to each of these lines. At a time of reading or writing, the write/read circuit 140 drives the bit lines BL1 and /BL1 as described above, and controls the voltage to be applied to each of these lines.

Figure 15A:
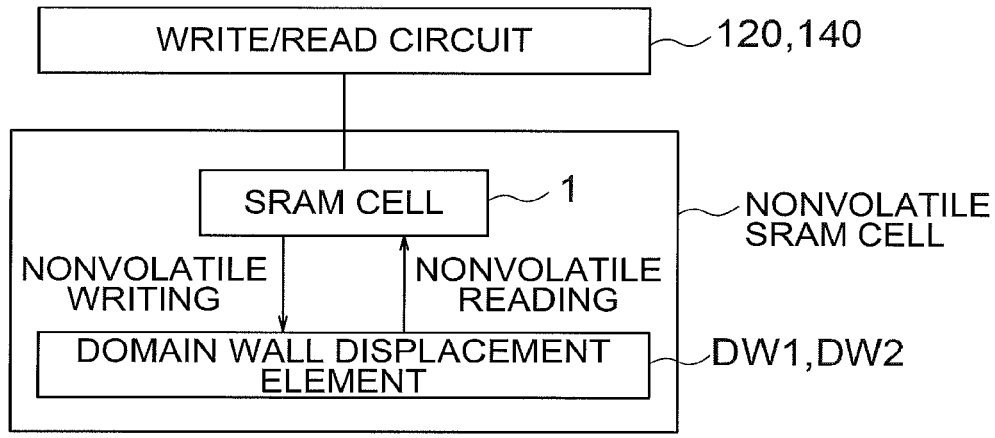
FIG. 15A is a block diagram for explaining an operation to be performed in the nonvolatile mode.
Figure 15B:
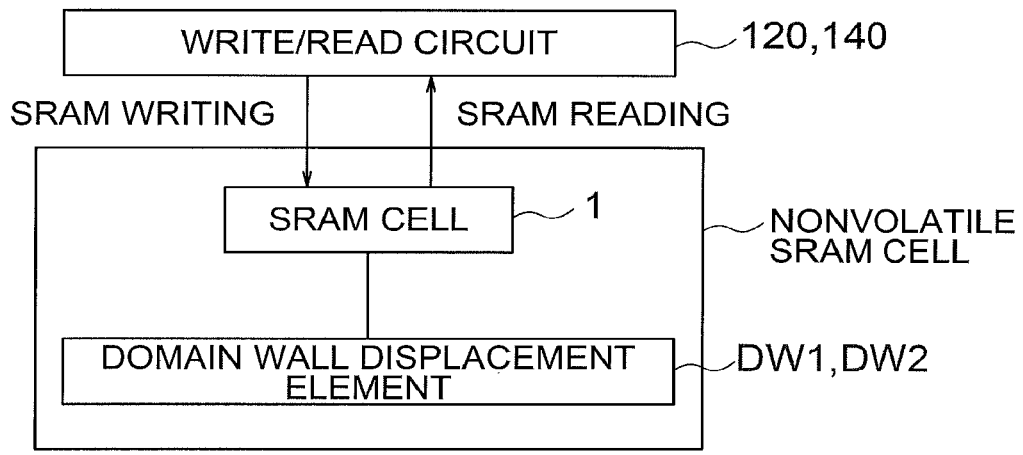
FIG. 15B is a block diagram for explaining an operation to be performed in the SRAM mode.

FIG. 15A shows the relationship among the write/read circuits 120 and 140, a SRAM cell 1, and the domain wall displacement elements DW1 and DW2 in an operation in the nonvolatile mode according to the first embodiment. FIG. 15B shows the relationship among the write/read circuits 120 and 140, a SRAM cell 1, and the domain wall displacement elements DW1 and DW2 in an operation in the SRAM mode.

As described above, according to the first embodiment, decrease in the reliability of each nonvolatile memory element can be reduced, without any SNM degradation.

Second Embodiment

Figure 16:
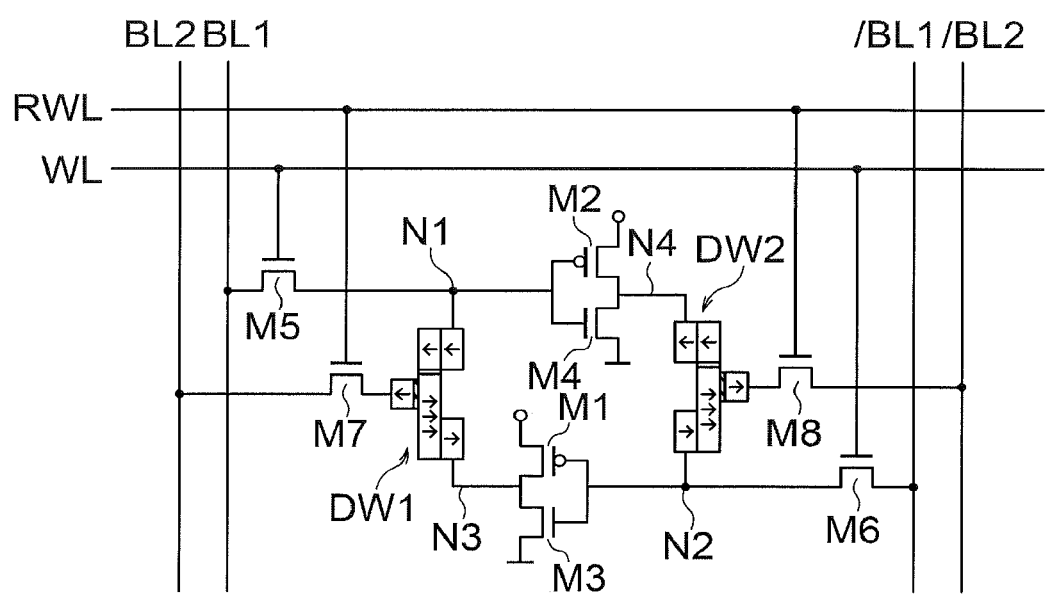
FIG. 16 is a circuit diagram showing a nonvolatile SRAM cell of a nonvolatile SRAM according to a second embodiment.

FIG. 16 shows a nonvolatile SRAM cell of a nonvolatile SRAM according to a second embodiment. The SRAM cell according to the second embodiment is the same as the nonvolatile SRAM cell according to the first embodiment shown in FIG. 1, except for further including a pair of bit lines BL2 and /BL2. In this case, one of the source and the drain of the transistor M7 is connected not to the bit line BL1 but to the bit line BL2. Also, one of the source and the drain of the transistor M8 is connected not to the bit line /BL1 but to the bit line /BL2. That is, the nonvolatile SRAM of the second embodiment is a dual-port SRAM.

(Writing)

In the second embodiment designed as described above, the method of writing in the SRAM mode differs between when a first port is selected or when the bit lines BL1 and /BL1 are selected, and when a second port is selected or when the bit lines BL2 and /BL2 are selected.

When the first port is selected, the same write operation as that in the SRAM mode described in the first embodiment is performed with the word line WL and the bit lines BL1 and /BL1.

When the second port is selected, the same write operation as that in the nonvolatile mode described in the first embodiment may be performed with the read word line RWL and the bit lines BL2 and /BL2.

(Reading)

When the first port is selected, the bit lines BL1 and /BL1 are precharged, and the word line WL is selected. A read operation is then performed in the same manner as in the SRAM mode.

When the second port is selected, the bit lines BL2 and /BL2 are precharged, and the read word line RWL is selected. A read operation is then performed in the same manner as in the nonvolatile mode.

In the nonvolatile SRAM of the second embodiment, write/read operations in the SRAM mode and the nonvolatile mode can be performed with the write/read circuits 120 and 140 shown in FIG. 14, as in the first embodiment. In this case, the write/read circuit 140 drives the two pairs of bit lines BL1 and /BL1, and BL2 and /BL2 provided in each SRAM cell.

Like the first embodiment, the second embodiment can reduce decrease in the reliability of each nonvolatile memory element.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A storage device comprising:
   first and second magnetic elements each including first through third terminals, each of the first and second magnetic elements including: a first magnetic layer including first through third magnetic regions, the second magnetic region being located between the first magnetic region and the third magnetic region; a second magnetic layer connected to the first terminal and the first magnetic region; and a third magnetic layer connected to the second terminal and the third magnetic region, the third magnetic layer having a different magnetization direction from a magnetization direction of the second magnetic layer; a fourth magnetic layer connected to the third terminal and facing the second magnetic region; and a nonmagnetic layer disposed between the second magnetic region and the fourth magnetic layer;
   a first inverter including a p-channel first transistor, an n-channel second transistor, a first input terminal, and a first output terminal, the first input terminal being connected to the second terminal of the second magnetic element, the first output terminal being connected to the first terminal of the first magnetic element;
   a second inverter including a p-channel third transistor, an n-channel fourth transistor, a second input terminal, and a second output terminal, the second input terminal being connected to the second terminal of the first magnetic element, the second output terminal being connected to the first terminal of the second magnetic element, a fifth transistor, one of the source and the drain of the fifth transistor being connected to the second terminal of the first magnetic element and the second input terminal of the second inverter;

a sixth transistor, one of the source and the drain of the sixth transistor being connected to the second terminal of the second magnetic element and the first input terminal of the first inverter;

a seventh transistor, one of the source and the drain of the seventh transistor being connected to the third terminal of the first magnetic element;

an eighth transistor, one of the source and the drain of the eighth transistor being connected to the third terminal of the second magnetic element;

a first wiring to which the gate of each of the fifth and sixth transistors is connected;

a second wiring to which the gate of each of the seventh and eighth transistors is connected;

a third wiring to which the other one of the source and the drain of each of the fifth and seventh transistors is connected; and a fourth wiring to which the other one of the source and the drain of each of the sixth and eighth transistors is connected.

2. The device according to claim 1, wherein, in each of the first and second magnetic elements, the magnetization direction of the second magnetic layer is different from a magnetization direction of the fourth magnetic layer.

3. The device according to claim 1, further comprising:
a first write circuit configured to perform a first write operation to equalize nonvolatile data stored in the first and second magnetic elements, the first write operation including applying voltage to the second wiring to put the seventh and eighth transistors into an OFF state, applying voltage to the first wiring to put the fifth and sixth transistors into an ON state, setting potential of the third and fourth wirings at a first level, flowing current between the first inverter and the third wiring via the first magnetic element and the fifth transistor, and flowing current between the second inverter and the fourth wiring via the second magnetic element and the sixth transistor.

4. The device according to claim 3, wherein the first write circuit performs a second write operation to write nonvolatile data into one of the first and second magnetic elements, the second write operation including applying voltage to the second wiring to put the seventh and eighth transistors into an OFF state, applying voltage to the first wiring to put the fifth and sixth transistors into an ON state, setting potential of the third and fourth wirings at a second level, and flowing current between one of the third and fourth wirings and the one of the first and second magnetic elements via one of the fifth and sixth transistors.

5. The device according to claim 4, wherein the first write circuit performs the first write operation before the second write operation.

6. The device according to claim 1, further comprising
a first read circuit configured to apply voltage to the second wiring to put the seventh and eighth transistors into an ON state, apply voltage to the first wiring to put the fifth and sixth transistors into an OFF state, set potential of the third and fourth wirings at a second level, and apply power supply voltage to the sources of the first and third transistors.

7. The device according to claim 1, further comprising
a second write circuit configured to write SRAM data into one of the source and the drain of each of the fifth and sixth transistors by applying voltage to the second wiring to put the seventh and eighth transistors into an OFF state, setting potential of one of the third and fourth wirings at a first level and potential of the other one of the third and fourth wirings at a second level, and applying voltage to the first wiring line to put the fifth and sixth transistors into an ON state.

8. The device according to claim 1, further comprising
a second read circuit configured to read SRAM data by applying voltage to the second wiring to put the seventh and eighth transistors into an OFF state, setting the third and fourth wirings at predetermined potential, and applying voltage to the first wiring to put the fifth and sixth transistors into an ON state.

9. The storage device according to claim 1, wherein the fourth magnetic layer has a fixed magnetization direction.

* * * * *